(12) United States Patent
Moest et al.

(10) Patent No.: US 11,644,755 B2
(45) Date of Patent: May 9, 2023

(54) LITHOGRAPHIC METHOD

(71) Applicant: ASML NETHERLANDS B.V., Veldhoven (NL)

(72) Inventors: Bearrach Moest, Eindhoven (NL); Rowin Meijerink, Leiden (NL); Thijs Schenkelaars, Eindhoven (NL); Norbertus Josephus Martinus Van Den Nieuwelaar, Tilburg (NL); Laurentius Johannes Adrianus Van Bokhoven, Veldhoven (NL)

(73) Assignee: ASML NETHERLAND B.V., Veldhoven (NL)

( * ) Notice: Subject to any disclaimer, the term of this patent is extended or adjusted under 35 U.S.C. 154(b) by 0 days.

(21) Appl. No.: 17/279,648

(22) PCT Filed: Sep. 11, 2019

(86) PCT No.: PCT/EP2019/074223
§ 371 (c)(1),
(2) Date: Mar. 25, 2021

(87) PCT Pub. No.: WO2020/074198
PCT Pub. Date: Apr. 16, 2020

(65) Prior Publication Data
US 2021/0389676 A1    Dec. 16, 2021

(30) Foreign Application Priority Data

Oct. 9, 2018   (EP) .................................... 18199310

(51) Int. Cl.
*G03F 7/20*   (2006.01)

(52) U.S. Cl.
CPC ............. *G03F 7/705* (2013.01); *G03F 7/706* (2013.01); *G03F 7/70358* (2013.01); *G03F 7/70983* (2013.01)

(58) Field of Classification Search
CPC ...... G03F 7/705; G03F 7/70358; G03F 7/706; G03F 7/70983; G03F 7/70;
(Continued)

(56) References Cited

U.S. PATENT DOCUMENTS

| 2005/0140949 | A1* | 6/2005 | Jasper ................. G03F 7/70308 355/53 |
| 2017/0357159 | A1 | 12/2017 | Kant et al. |
| 2018/0095369 | A1* | 4/2018 | Van De Ruit ....... G03F 7/70258 |

FOREIGN PATENT DOCUMENTS

| DE | 10321680 | 12/2004 |
| KR | 20040094369 | 11/2004 |

(Continued)

OTHER PUBLICATIONS

International Search Report and Written Opinion issued in corresponding PCT Patent Application No. PCT/EP2019/074223, dated Dec. 3, 2019.
(Continued)

*Primary Examiner* — Christina A Riddle
(74) *Attorney, Agent, or Firm* — Pillsbury Winthrop Shaw Pitman, LLP

(57) ABSTRACT

A method of predicting deflection of a pellicle which will occur during movement of the pellicle in a lithographic apparatus, the method including receiving parameters regarding properties of the pellicle and receiving parameters regarding the expected movement of the pellicle. The parameters are applied to a model which predicts deflection of the pellicle as a function of those parameters. The model includes a plurality of sub-models which relate to different components of deflection of the pellicle. An output of the model may be used to predict.

20 Claims, 7 Drawing Sheets

(58) Field of Classification Search
CPC ............. G03F 7/70191; G03F 7/70283; G03F 7/70308; G03F 7/70316; G03F 7/70491–70541; G03F 7/70591; G03F 7/70691; G03F 7/70716; G03F 7/70725; G03F 7/70733; G03F 7/70741; G03F 7/70775; G03F 7/70783; G03F 7/708; G03F 7/70808; G03F 7/70825; G03F 7/70841; G03F 7/7085; G03F 7/70858–70891; G03F 7/70908–70933; G03F 7/70975; G03F 7/70991; G03F 1/62; G03F 1/64; G03F 1/68; G03F 1/82

USPC .......... 355/30, 52–55, 67–77; 430/5, 22, 30, 430/311
See application file for complete search history.

(56) References Cited

FOREIGN PATENT DOCUMENTS

| | | |
|---|---|---|
| TW | 201631405 | 9/2016 |
| WO | 2018015121 | 1/2018 |

OTHER PUBLICATIONS

Cotte, E.P. et al.: "Dynamic studies of hard pellicle response during exposure scanning", Journal of Vacuum Science & Technology, Part B, vol. 20, No. 6 (2002).
Taiwanese Office Action issued in corresponding Taiwanese Patent Application No. 108135631, dated Oct. 29, 2020.
Taiwanese Office Action issued in corresponding Taiwanese Patent Application No. 108135631, dated Aug. 27, 2020.
Office Action issued in corresponding Korean Patent Application No. 10-2021-7010515, dated Feb. 2, 2023.

* cited by examiner

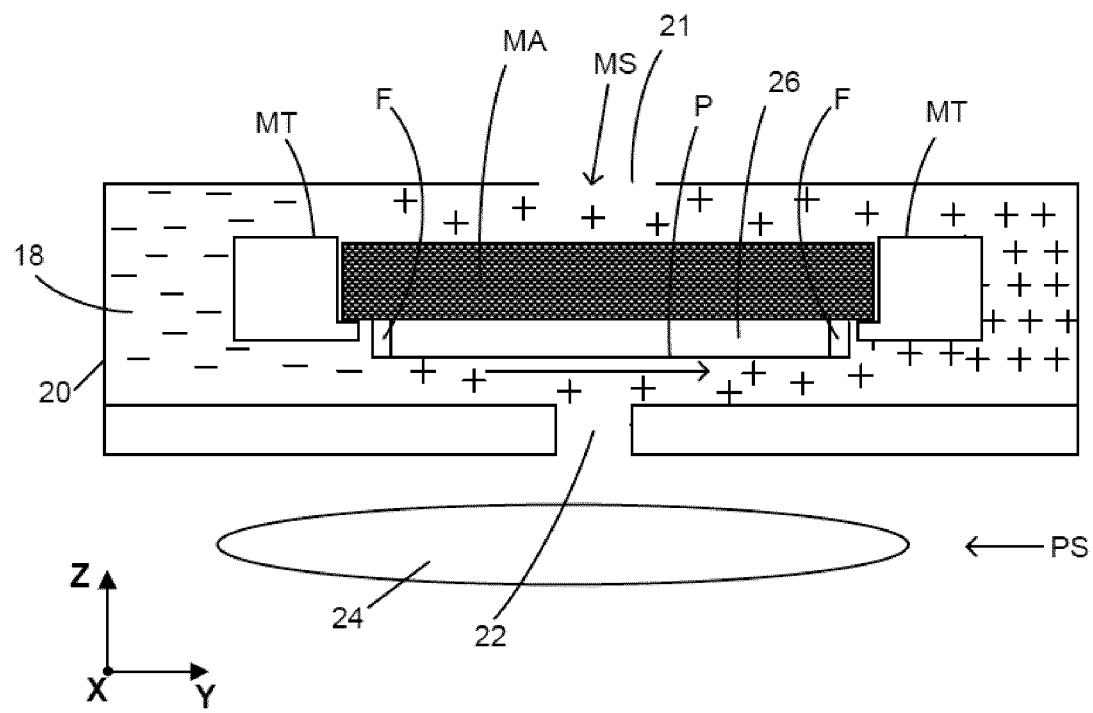
Fig. 3
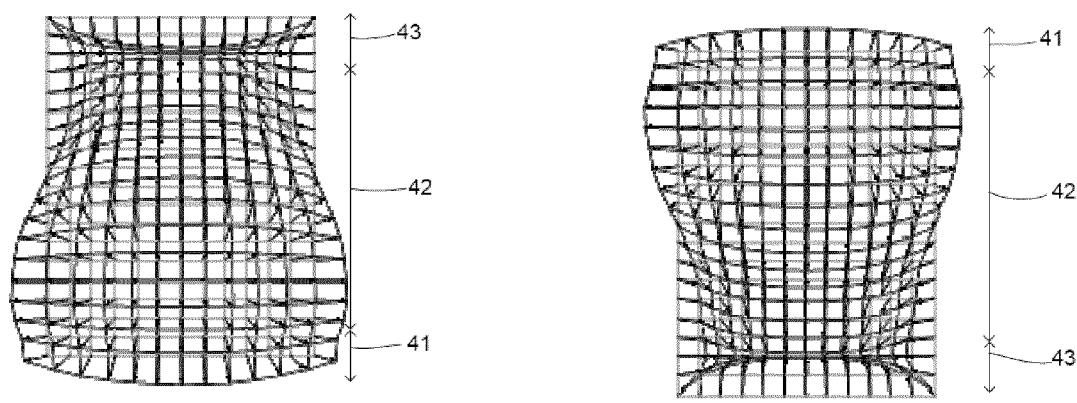
Fig. 4A
Fig. 4B

LITHOGRAPHIC METHOD

CROSS-REFERENCE TO RELATED APPLICATIONS

This application is the U.S. national phase entry of PCT Patent Application No. PCT/EP2019/074223 which was filed on Sep. 11, 2019, which claims the benefit of priority of European Patent Application No. 18199310.6 which was filed on Oct. 9, 2018 and which is incorporated herein in its entirety by reference.

FIELD

The present invention relates to a method of predicting deflection of a pellicle which will occur during movement of the pellicle in a lithographic apparatus. The predicted deflection of the pellicle may then be used to correct for lithographic errors, for example, overlay errors, which would otherwise have resulted from the deflection of the pellicle during a lithographic exposure.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask or reticle) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm, 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

It is conventional in deep-ultraviolet (DUV) lithographic apparatus to attach a pellicle to the reticle for preventing the reticle from contamination. The pellicle is a transmissive film, which is spaced a few mm, for example about 5 mm, away from the patterned area on the reticle. A contamination particle, which is received on the pellicle, is in the far field with respect to the pattern of the mask, and consequently does not have a significant impact upon the quality of image that is projected by the lithographic apparatus on to a substrate. If the pellicle was not present, then the contamination particle would lie on the pattern of the reticle and would obscure a portion of the pattern. Thereby, preventing the pattern from being projected correctly on to the substrate. The pellicle, thus, plays an important role in preventing contamination particles from adversely affecting the projection of a pattern on to a substrate by the lithographic apparatus.

Although the pellicle provides a useful and valuable function, the pellicle causes an undesirable side effect in that it will itself have an effect upon the image which is projected by the lithographic apparatus on to the substrate. This is because the pellicle has a finite thickness and a refractive index which is greater than its environmental gas, for example air, and thus will cause some deflection of any radiation which is not perpendicularly incident upon the pellicle. It is desirable to provide, for example, a method which obviates, or mitigates, one or more problems of the prior art, whether identified herein or elsewhere.

SUMMARY

According to a first aspect of the invention there is provided a method of predicting a deflection of a pellicle which will occur during movement of the pellicle in a lithographic apparatus, the method comprising receiving first parameters regarding properties of the pellicle and receiving second parameters regarding the expected movement of the pellicle, and applying the first and second parameters to a model which predicts the deflection of the pellicle as a function of the first and second parameters, wherein the model comprises a plurality of sub-models which relate to different components of the deflection of the pellicle.

Prediction of the deflection of the pellicle enables determination and preemptive correction of lithographic errors associated with the pellicle deflection. The method of predicting the deflection advantageously increases availability of the lithographic apparatus due to the reduced time required to measure lithographic errors. The method of predicting the deflection advantageously avoids the need to perform measurements each time a different exposure is to be performed using the lithographic apparatus. The lithographic errors associated with the predicted pellicle deflection may be used to reduce matching errors associated with exposing a single substrate using different lithographic apparatuses (e.g., DUV and EUV lithographic apparatus). Parameters that serve as an input to the sub-models may be calibrated per pellicle type rather than per lithographic exposure type, thereby enabling greater flexibility compared to known methods.

The outputs from the plurality of sub-models may be combined by the model. The model may include an assumption that the plurality of sub-models are independent of one another.

At least one of the plurality of sub-models may relate to a component of the deflection of the pellicle arising from at least one of the following first set of aspects of the movement of the pellicle: a time at which a rate of change of an acceleration of the pellicle is non-zero; a rate of change of an acceleration of the pellicle; and, an acceleration of the pellicle.

A first sub-model may be arranged to use at least one of the first set of aspects to model the deflection of the pellicle as a damped wave arising from a vibration of the pellicle.

A second sub-model may be arranged to use at least one of the first set of aspects to model the deflection of the pellicle as an exponential decay arising from an inertia of a gas that is in communication with the pellicle.

At least one of the plurality of sub-models may relate to a component of the deflection of the pellicle arising from at least one of the following second set of aspects of the movement of the pellicle: a velocity of the pellicle; and, a position of the pellicle.

A third sub-model may be arranged to use at least one of the second set of aspects to model the deflection of the pellicle as a deformation arising from pressure variations of a gas that is in communication with the pellicle during movement of the pellicle.

A second sub-model may be arranged to use at least one of the first set of aspects to model the deflection of the pellicle as an exponential decay arising from an inertia of a gas that is in communication with the pellicle, and wherein at least one of the plurality of sub-models relates to a component of the deflection of the pellicle arising from at least one of the following second set of aspects of the movement of the pellicle: a velocity of the pellicle and a position of the pellicle. The third sub-model may be arranged to use at least one of the second set of aspects to model the deflection of the pellicle as a deformation arising from pressure variations of a gas that is in communication with the pellicle during movement of the pellicle. The third sub-model may further be arranged to model the deflection of the pellicle which is not accommodated by the first and second sub-models.

According to a second aspect of the invention, there is provided a method of performing a scanning exposure of a target portion of a substrate using a lithographic apparatus, the method comprising loading a reticle and a pellicle into the lithographic apparatus, passing a radiation beam through the reticle and through the pellicle during scanning movement of the reticle and the pellicle and during scanning movement of the substrate, using a projection system of the lithographic apparatus to project the radiation beam onto the target portion of the substrate, and adjusting at least one of a lens of the projection system, the scanning movement of the substrate and a scanning movement of the reticle and pellicle during the scanning exposure to compensate for a lithographic error due to deflection of the pellicle, the deflection of the pellicle having been predicted using a method according to the first aspect of the invention.

Adjusting at least one of a lens of the projection system, the scanning movement of the substrate and a scanning movement of the reticle and pellicle during the scanning exposure to compensate for the lithographic error provides robustness for both intended and unintended variations in exposure conditions and does not require additional correction time per exposure.

According to a third aspect of the invention, there is provided a computer program comprising computer readable instructions configured to control a computer to carry out a method according to the first aspect of the invention and/or the second aspect of the invention.

According to a fourth aspect of the invention, there is provided a computer readable medium carrying a computer program according to the third aspect of the invention.

According to a fifth aspect of the invention, there is provided a computer apparatus for predicting deflection of a pellicle which will occur during movement of the pellicle in a lithographic apparatus comprising a memory storing processor readable instructions, and a processor arranged to read and execute instructions stored in said memory, wherein said processor readable instructions comprise instructions arranged to control the computer to carry out a method according to the first aspect of the invention and/or the second aspect of the invention.

According to a sixth aspect of the invention, there is provided a lithographic apparatus arranged to project a pattern from a patterning device onto a substrate, the lithographic apparatus comprising a computer apparatus according to the fifth aspect of the invention.

According to a seventh aspect of the invention, there is provided a metrology device comprising a computer apparatus according to the fifth aspect of the invention.

According to an eighth aspect of the invention, there is provided a method of generating a model for predicting the deflection of a pellicle which will occur during movement of the pellicle in a lithographic apparatus, the method comprising determining a lithographic error resulting from the deflection of the pellicle, converting the determined lithographic error into a corresponding deflected pellicle shape, forming a plurality of sub-models which relate to different components of the deflection of the pellicle, and calibrating each sub-model by fitting the plurality of sub-models to the deflected pellicle shape.

BRIEF DESCRIPTION OF THE DRAWINGS

Embodiments of the invention will now be described, by way of example only, with reference to the accompanying schematic drawings, in which:

FIG. 3 schematically depicts in more detail a part of the lithographic apparatus of FIG. 1 comprising the pellicle;

FIG. 4, consisting of FIGS. 4A and 4B, shows overlay errors caused by pellicle deflections resulting from movement of the pellicle during a scanning exposure;

DETAILED DESCRIPTION

In the present document, the terms "radiation" and "beam" are used to encompass all types of electromagnetic radiation, including ultraviolet radiation (e.g., with a wavelength of 365, 248, 193, 157 or 126 nm) and EUV (extreme ultra-violet radiation, e.g., having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
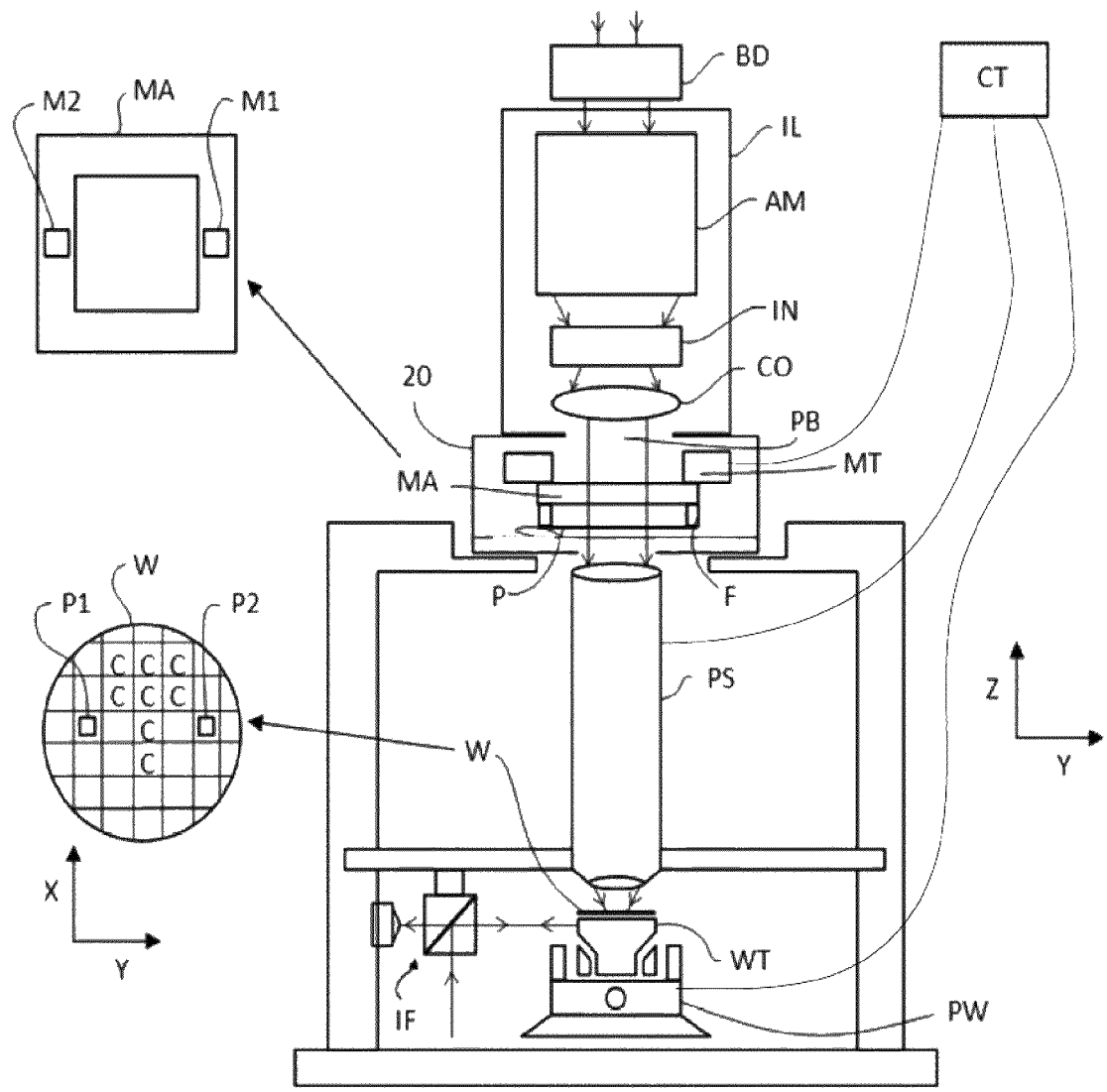
FIG. 1 depicts a schematic overview of a lithographic apparatus.

FIG. 1 schematically depicts a lithographic apparatus according to a particular embodiment of the invention. The lithographic apparatus comprises an illumination system ("illuminator") IL configured to condition a beam PB of radiation (e.g., UV radiation or DUV radiation); a support structure MT supporting a mask MA, the support structure MT being connected to a positioning device (not depicted)

to accurately position the mask MA with respect to a projection system PS; a substrate table (e.g., a wafer table) WT for holding a substrate (e.g., a resist coated wafer) W and connected to a positioning device PW for accurately positioning the substrate with respect to item the projection system PS; and the projection system (e.g., a refractive projection lens) PS configured to image a pattern imparted to the radiation beam PB by mask MA onto a target portion C (e.g., comprising one or more dies) of the substrate W.

As here depicted, the lithographic apparatus is of a transmissive type (e.g., employing a transmissive mask). Alternatively, the lithographic apparatus may be of a reflective type (e.g., employing a programmable mirror array).

A pellicle P is attached to a frame F which is in turn attached to the mask MA. The pellicle P is a transmissive film which is spaced away from a pattern on the mask MA. The pellicle P prevents contamination particles from being incident upon the pattern of the mask MA, and holds such contamination particles away from the mask pattern. The pellicle P may for example be separated from the mask pattern by a few mm, for example approximately 5 mm. The mask MA, frame F and pellicle P are all located within an environment defined by a housing 20.

The illuminator IL receives a beam of radiation from a radiation source (not shown). The radiation source and the lithographic apparatus may be separate entities, for example when the source is an excimer laser. In such cases, the source is not considered to form part of the lithographic apparatus and the radiation beam is passed from the source to the illuminator IL with the aid of a beam delivery system BD comprising, for example, suitable directing mirrors and/or a beam expander. In other cases the source may be integral part of the lithographic apparatus, for example, when the source is a mercury lamp. The source and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator IL provides a conditioned beam of radiation PB, having a desired uniformity and intensity distribution in its cross section.

The radiation beam PB is incident on the mask MA, which is held by the support structure MT. Having traversed the mask MA, the radiation beam PB passes through the pellicle P and then passes into the projection system PS. The projection system PS focuses the beam PB onto a target portion C of the substrate W. With the aid of the positioning device PW and position sensor IF (e.g., an interferometric device), the substrate table WT can be moved accurately, e.g., so as to position different target portions C in the path of the beam PB. Similarly, the support structure MT can be used to accurately position the mask MA with respect to the path of the beam PB, for example during a scanning exposure. The mask MA and the substrate W may be aligned using mask alignment marks M1, M2 and substrate alignment marks PI, P2.

The lithographic apparatus may be used to perform a scanning exposure. In a scanning exposure the support structure MT and the substrate table WT are scanned synchronously while a pattern imparted to the beam PB is projected onto a target portion C, i.e., a single dynamic exposure. The velocity and direction of the substrate table WT relative to the support structure MT is determined by the de-magnification and image reversal characteristics of the projection system PS.

The lithographic apparatus further comprises a controller CT. The controller CT is configured to output adjustments to be applied to the lithographic apparatus during scanning exposures. The adjustments may comprise adjusting at least one of a lens of the projection system PS, the scanning movement of the substrate W and the scanning movement of the reticle MA and pellicle P during the scanning exposure. The adjustments performed by the controller CT may at least partially compensate for a lithographic error caused by deflection of the pellicle P. The deflection of the pellicle P may be predicted using a method according to an embodiment of the invention, e.g., a method as described below.

The pellicle P will have an effect upon the patterned radiation beam PB which passes through it. The pellicle P deflects dynamically during a scanning exposure. This dynamic deflection introduces unwanted aberrations into the image projected by the lithographic apparatus onto the substrate W which in turn lead to lithographic errors such as overlay errors. Embodiments of the invention address this issue and allow the lithographic errors to be reduced.

Figure 2:
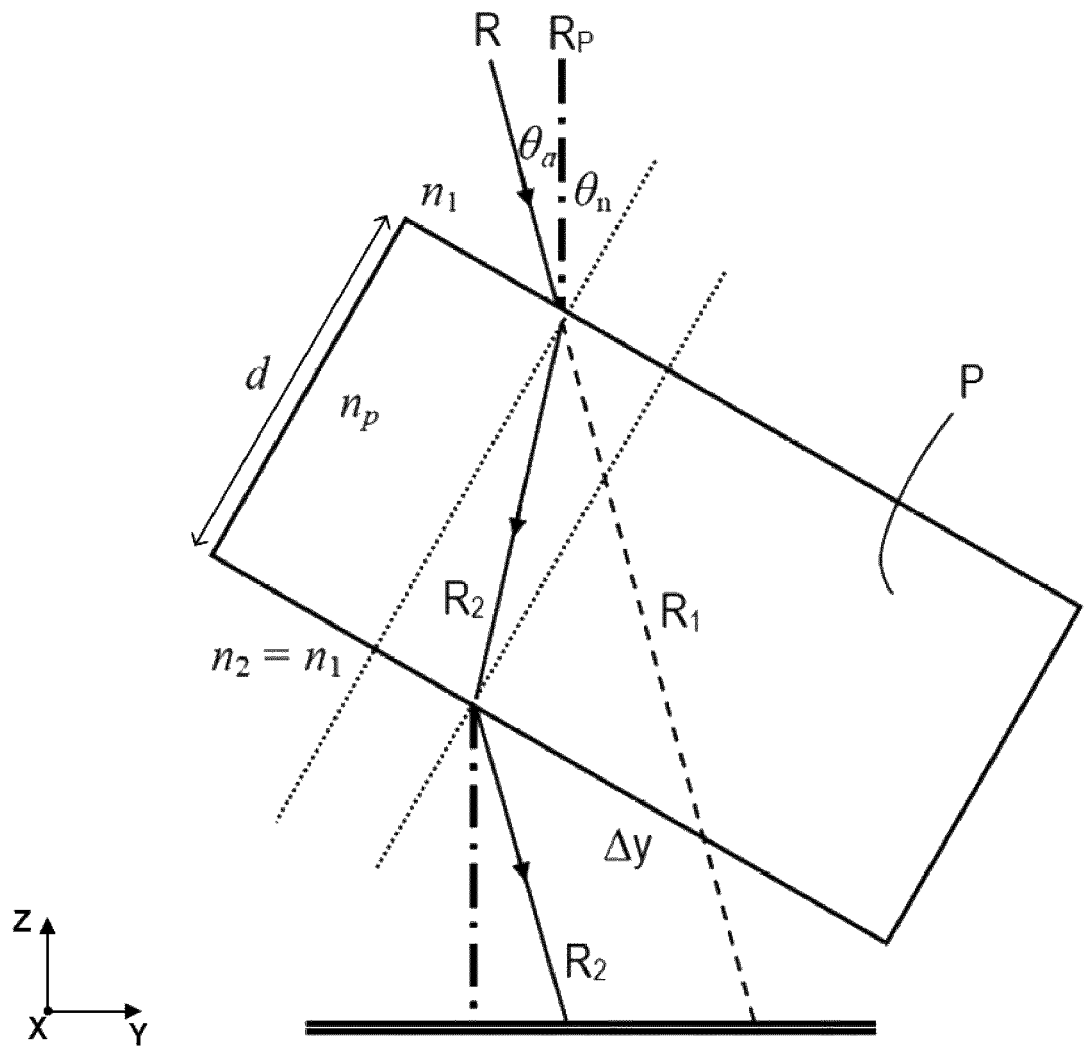
FIG. 2 schematically depicts an offset of a radiation beam caused by a deflection of the pellicle.

FIG. 2 schematically depicts an offset of a radiation beam PB which will be caused by the pellicle P when the pellicle P (or part of the pellicle) is at an angle relative to the optical axis of the lithographic apparatus. To aid explanation of the offset Cartesian coordinates are included in FIG. 2. The Cartesian coordinates, which are also used in other figures, are in accordance with the convention for a scanning lithographic apparatus. The y-direction is the scanning direction, i.e., the direction of movement during a scanning exposure, the x-direction is in the plane of the mask in the non-scanning direction, and the z-direction is the optical axis of the lithographic apparatus.

The pellicle P has a refractive index $n_p$ which is greater than the refractive index $n_1$, $n_2$ of the gas, for example air, on either side of the pellicle P. The pellicle P has a thickness d. The offset introduced by the pellicle P is in accordance with Snell's Law and is determined in part by the thickness d of the pellicle P and the refractive index $n_p$ of the pellicle P. In addition, because the pellicle P is at an angle $\theta_n$ relative to the XY-plane, the XY offset is further determined by the angle of the pellicle P relative to the XY plane. The principal ray $R_p$ of the system is shown as a dotted and dashed line and a ray R at an angle $\theta_a$ relative to the principal ray $R_p$ is also shown. A dashed line $R_1$ shows how the ray R would propagate without the pellicle P present. The solid line $R_2$ shows how the ray R propagates when pellicle P is present. As may be seen, there is a significant shift $\Delta y$ in the y-direction of the ray $R_2$ compared with the ray $R_1$ that would be seen if the pellicle P was not present. As may also be understood from FIG. 2, the displacement of the ray R depends in part upon the angle $\theta_n$ of the pellicle P with respect to the XY-plane. The principle ray $R_p$ will be shifted by a lesser amount than the ray R. A ray (not shown) which is perpendicular to the pellicle P will not be shifted.

FIG. 3 schematically depicts in more detail part of the lithographic apparatus of FIG. 1. As in FIG. 1, a pellicle P is fixed to a pellicle frame F which in turn is attached to a mask MA. The mask MA is attached to a support structure MT. The pellicle P, pellicle frame F and mask MA may be referred to as a mask assembly MS. The mask assembly MS and the support structure MT are located in an environment 18 defined by a housing 20. The environment 18 defined by the housing 20 may be referred to as the mask assembly environment 18.

The housing 20 is open at an upper end 21, opposite the mask MA, to receive a radiation beam PB (see FIG. 1) and is open at a lower end 22, opposite the pellicle P, to allow the patterned radiation beam to travel to the projection system PS of the lithographic apparatus (see FIG. 1). The lower opening 22 may be referred to as an exposure slit 22. An uppermost lens 24 of the projection system PS (see FIG. 1) is schematically depicted in FIG. 3.

Gas, for example air, may be present in the mask assembly environment 18. The gas may be provided at a pressure which is higher than the pressure in the projection system PS in order to inhibit contamination particles from travelling from the projection system PS into the mask assembly environment 18.

A volume 26 is enclosed by the pellicle P, mask MA and frame F. Gas may be contained in the volume 26. The volume 26 is connected to the mask assembly environment 18 by a leakage path (not depicted), which allows gas (for example air) to flow between them. The leakage path is restricted such that the rate at which gas may travel between the volume 26 and the mask assembly environment 18 is limited. The rate of flow of gas is sufficiently low such that during a scanning exposure an amount of gas in the volume 26 may be considered to be fixed.

During a scanning exposure, the support structure MT and mask assembly MS move rapidly from one side of the housing 20 to the other side in the y-direction (as indicated by the arrow in FIG. 3). The scanning exposure may, for example, be performed within around 100 milliseconds.

As is schematically depicted in FIG. 3, during the scanning movement of the mask assembly MS from left to right, the pressure of gas at the right hand side of the mask assembly MS and support structure MT will increase because the volume containing that gas is being reduced. At the same time, the pressure on the left hand side of the mask assembly MS and support structure MT is reduced because the volume containing that gas is increased. As a result, the gas flows around the mask assembly MS and support structure MT until the gas pressure has equalized in the mask assembly environment 18. This flow of gas is one example of a cause of a deflection of the pellicle P. The deflection may change during the scanning movement of the pellicle P. The deflection consists of bending of the pellicle surface, and this introduces aberrations into the image that is projected by the lithographic apparatus onto the substrate W. As explained above in connection with FIG. 2, when the pellicle P is at a non-zero angle relative to the mask MA this introduces an offset into the projected image. Because the pellicle P bends and thus has a range of angles relative to the mask MA the pellicle doesn't introduce a simple offset but instead introduces aberrations into the projected image. Furthermore, the aberrations introduced by the pellicle P vary during the scanning exposure. This is because the patterned radiation beam scans along the pellicle P during scanning movement of the mask assembly MS, and different parts of the pellicle P will be bent in different ways.

FIG. 4 shows overlay errors within an exposure field caused by pellicle deflections resulting from movement of the pellicle P during a scanning exposure. FIG. 4A shows the overlay errors associated with a portion of the scanning exposure in which the pellicle P moves in the positive y-direction, i.e., a "scan-up" portion of the scanning exposure. FIG. 4B shows the overlay errors associated with a portion of the scanning exposure in which the pellicle P moves in the negative y-direction, i.e., the "scan-down" portion of the scanning exposure. In the example of FIG. 4, the overlay errors are represented as a deformed grid of black arrows whereby the size of the arrow indicates the magnitude of the overlay error at a given location on the target portion C of the substrate W. The tail of a given arrow indicates an intended location of part a projected image and the head of the arrow indicates the actual location of the part of the projected image after aberrations have been introduced to the projected image by the deflected pellicle P.

The overlay errors shown in FIG. 4 are triggered by deflection of the pellicle P as the support structure MT (or reticle stage) moves back and forth along a scanning direction (e.g., the y-direction) during exposure of the substrate W. As can be seen on comparison between FIG. 4A and FIG. 4B, the overlay errors caused by the scan-up and scan-down movements differ from one another. The deflection of the pellicle P may be substantially the same in both scan-up and scan-down movements, it is just that the orientation of the pellicle P with respect to the target portion changes when switching from scan-up to scan-down. That is, the deflection of the pellicle P in the scan-up portion of the scanning exposure (FIG. 4A) may be substantially a mirror image of the deflection of the pellicle P in the scan-down portion of the scanning exposure (FIG. 4B). Alternatively, the deflection of the pellicle P during the scan-up movement may differ from the deflection of the pellicle P during the scan-down movement. Factors that may contribute to a difference between the deflection experienced by the pellicle during scan-up movement versus a scan-down movement may, for example, include the image that is to be projected through the pellicle, properties of the local environment 18 of the pellicle P and/or the reticle MA (e.g., a geometry and/or local pressure variations of the reticle stage environment 18), etc.

Since the motion of the reticle stage MT is relevant, not all target portions of the substrate W will experience the same overlay error. This is especially true for target portions C of the substrate W that undergo partial exposures. This is also especially true for the first target portions C that undergo an exposure after the row and/or column of target portions C that are being exposed changes. For example, when a first column of target portions has been exposed to radiation, the substrate table WT may move to an adjacent column of target portions C before exposures begin again. This movement takes additional time compared to the movement of the substrate table WT from one target portion C of a column to another target portion C of the same column. This additional time may result in a difference of a behavior of the pellicle P after the row and/or column of target portions C that are being exposed changes between exposures compared to when the row/column is not changed between exposures.

Figure 5:
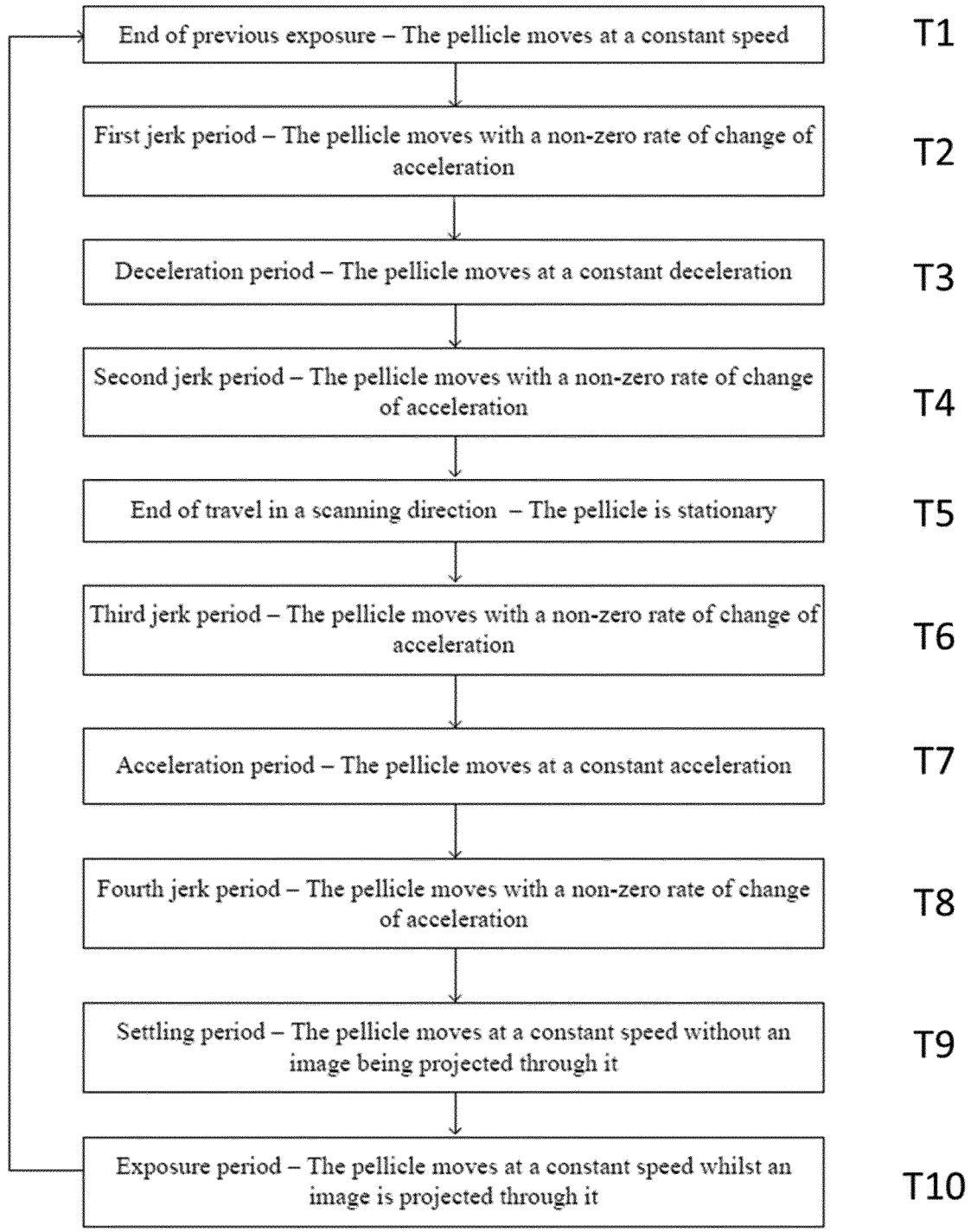
FIG. 5 shows different periods of time involved in a typical exposure scan cycle.

Pressure variations within the environment 18 of the pellicle are not the only source of pellicle deflection. Different aspects of movement of the pellicle P contribute to the total deflection experienced by the pellicle P during an exposure scan. FIG. 5 shows the different periods of time involved in a typical exposure scan cycle. An exposure scan may be broken down into different periods of movement of the reticle stage MT and pellicle P. In the example of FIG. 5, the first period of movement T1 of the reticle stage MT and pellicle P is the end of a previous exposure of a target portion C of the substrate W. That is, the projection of an image onto the previous target portion C of the substrate W has just ended. During the end of the previous exposure the reticle and pellicle move at a constant speed. The reticle MA and the pellicle P may move along a scanning direction at a speed of greater than about 0.5 m$^{-1}$. The reticle MA and pellicle P may move along a scanning direction at a speed of less than about 10 ms$^{-1}$. The next period of time in the exposure scan cycle of FIG. 5 is a first jerk period T2 during which a rate of change of an acceleration of the pellicle P is non-zero. The first jerk period T2 may, for example, have a duration of greater than about 0.001 s. The first jerk period T2 may, for example, have a duration of less than about 0.03 s. The first jerk period T2 may be followed by a deceleration period T3 during which the reticle stage MT and the pellicle P experience a constant deceleration. The reticle MA and the pellicle P may, for example, experience an absolute acceleration of greater than about 50 ms$^{-2}$ during the deceleration period T3. The reticle MA and the pellicle P may, for example, experience an absolute acceleration of less than about 200 ms$^{-2}$ during the deceleration period T3. The deceleration period T3 may, for example, have a duration of greater than about 1 ms. The deceleration period T3 may, for example, have a duration of less than about 50 ms. The deceleration period T3 may be followed by a second jerk period T4 during which a rate of change of an acceleration of the pellicle is non-zero. The second jerk period T4 may, for example, have a duration of greater than about 0.001 s. The second jerk period T4 may, for example, have a duration of less than about 0.03 s. The first jerk period T2, the deceleration phase T3 and the second jerk period T4 may combine to form a first acceleration profile of the reticle and pellicle. The first acceleration profile of the reticle MA and the pellicle P may have a relatively great effect on the deflection experienced by the pellicle P during an exposure of the substrate W. The first acceleration profile may therefore comprise one or more important parameters to consider when modelling the deflection of the pellicle P. The first acceleration profile may, for example, have a duration of greater than about 1 ms. The first acceleration profile may, for example, have a duration of less than about 10 ms.

The second jerk period T4 may be followed by the end of travel T5 of the reticle stage MT and the pellicle P in a scanning direction. That is, the reticle stage MT reaches its maximum distance along a scanning direction and becomes stationary. At the end of the end of travel period T5, the pellicle P starts moving in the opposite scanning direction. The next period may be a third jerk period T6 during which a rate of change of an acceleration of the pellicle P is non-zero. The third jerk period T6 may, for example, have a duration of greater than about 1 ms. The third jerk period T6 may, for example, have a duration of less than about 30 ms. The third jerk period T6 may be followed by an acceleration period T7 during which the pellicle experiences a constant acceleration. The reticle MA and the pellicle P may, for example, experience an absolute acceleration of greater than about 50 ms$^{-2}$ during the acceleration period T7. The reticle MA and the pellicle P may, for example, experience an absolute acceleration of less than about 200 ms$^{-2}$ during the acceleration period T7. The acceleration period T7 may, for example, have a duration of greater than about 1 ms. The acceleration period T7 may, for example, have a duration of less than about 50 ms. The pellicle P experiences a constant magnitude of acceleration throughout the acceleration period T7 and the acceleration period, it is just the direction of the pellicle's movement that changes between these periods. The acceleration period T7 may be followed by a fourth jerk period T8 during which a rate of change of an acceleration of the pellicle P is non-zero. The fourth jerk period T8 may, for example, have a duration of greater than about 1 ms. The fourth jerk period T8 may, for example, have a duration of less than about 30 ms. The third jerk period T6, the acceleration period T7 and the fourth jerk period T8 may combine to form combine to form a second acceleration profile of the reticle MA and the pellicle P. The second acceleration profile of the reticle MA and the pellicle P may have a relatively great effect on the deflection experienced by the pellicle P during an exposure of the substrate W. The second acceleration profile may therefore comprise one or more important parameters to consider when modelling the deflection of the pellicle P. The second acceleration profile may, for example, have a duration of greater than about 1 ms. The second acceleration profile may, for example, have a duration of less than about 10 ms.

The fourth jerk period T8 may be followed by a settling period during which the pellicle P experiences a constant speed. The reticle MA and the pellicle P may move along a scanning direction at a speed of greater than about 0.5 ms$^{-1}$. The reticle MA and the pellicle P may move along a scanning direction at a speed of less than about 10 ms$^{-1}$. A target portion C of the substrate W is not exposed to radiation during the settling period T9. The settling period T9 may allow some time for the deflection of the pellicle P to partially settle before exposure of the next target portion C of the substrate W takes place. The setting period T9 may be followed by an exposure period T10 during which the reticle stage MT (and the pellicle P) moves at a constant speed whilst an image is projected through the pellicle P and onto the target portion C of the substrate W. The reticle MA and the pellicle P may move along a scanning direction at a speed of greater than about 0.5 ms$^{-1}$. The reticle MA and the pellicle P may move along a scanning direction at a speed of less than about 10 ms$^{-1}$. Once the image has been projected onto the target portion C of the substrate W the exposure period ends and the exposure scan cycle may begin again with the end of the previous exposure in preparation for an exposure of a different target portion C of the substrate W. The settling period T9, the exposure period T10 and the end of previous exposure may, for example, have a total duration of greater than about 10 ms. The settling period T9, the exposure period T10 and the end of previous exposure may, for example, have a total duration of less than about 100 ms. A total duration of the exposure scan cycle may depend at least in part upon a size of the target portion C of the substrate W and/or a scan speed of the reticle stage MT.

Referring again to FIG. 4, the exposure period may be thought of as comprising three sub-periods: an initial scan sub-period 41, a middle scan sub-period 42 and a final scan sub-period 43. These three sub-periods 41-43 are indicated on FIG. 4A (scan-up) and FIG. 4B (scan-down). The initial scan sub-period 41 may correspond with the second acceleration profile discussed above in relation to FIG. 5. The middle scan sub-period 42 may correspond with the settling period T9, the exposure period T10 and the end of previous exposure discussed above in relation to FIG. 5. The final scan period 43 may correspond with the first acceleration profile discussed above in relation to FIG. 5. As can be seen from FIG. 4, different sub-periods 41-43 of the exposure period T10 are associated with different overlay errors. The overlay errors associated with the deflection of the pellicle P may, for example, be greater than about 0.1 nm. The overlay errors associated with the deflection of the pellicle P may, for example, be less than about 6 nm.

The net deflection of the pellicle P may be understood as being a combination of deflections caused by different sources, e.g., pressure variations of an environment of the pellicle P and deflections caused by changes in motion of the pellicle P. It may be difficult to holistically model the pellicle deflection because the holistic model may involve a large number of interdependent variables which require a large amount of data and processing power to accurately model. The inventors have realized that the total deflection experienced by the pellicle P may be understood as being a combination of different components of deflection of the pellicle P in response to different aspect of movement of the pellicle P. That is, the inventors have realized that the deflection response of the pellicle P may be split apart according to their sources, i.e., the aspects of movement of the pellicle that contribute to deflection of the pellicle, and treated separately by a model. Each component of the deflection of the pellicle may be modeled by its own sub-model. Each sub-model may be configured to predict a contribution of a given component of the deflection of the pellicle to the total pellicle deflection. The predictions of each sub-model may then be combined to predict a total deflection of the pellicle P, for example, by combining the outputs of each sub-model whilst assuming that the sub-models are independent of one another. Parameters that contribute to the deflection of the pellicle P may be calibrated per sub-model and contributions to the total pellicle deflection may be calculated per sub-model.

Figure 6:
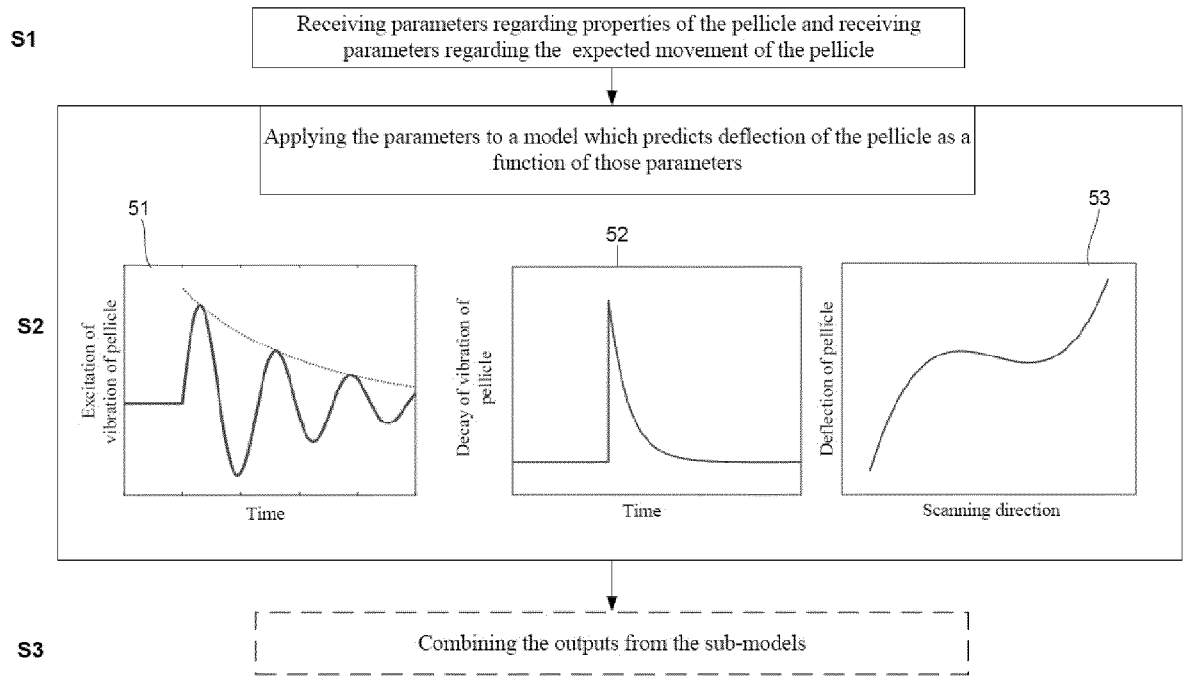
FIG. 6 shows a method of predicting deflection of a pellicle which will occur during movement of the pellicle in a lithographic apparatus according to an embodiment of the invention.

FIG. 6 shows a method of predicting deflection of a pellicle P, which will occur during movement of the pellicle P in a lithographic apparatus according to an embodiment of the invention. In the example of FIG. 6, the model has already been generated. Discussion of how the model may be generated may be found below in relation to FIG. 8. A first step S1 of the method includes receiving parameters regarding properties of the pellicle P and receiving parameters regarding the expected movement of the pellicle P.

First parameters regarding properties of the pellicle P may include, for example, a pellicle type, a tension or tensile stress under which the pellicle P is held in the pellicle frame F, a thickness d of the pellicle, a resonant frequency of the pellicle P when the pellicle P is held by the pellicle frame F, etc. First parameters regarding properties of the pellicle P may be measured and/or modelled. For example, a resonant frequency of the pellicle P when the pellicle P is held by the pellicle frame F may be measured in a lab. The tension under which the pellicle P is held in the pellicle frame F may, for example, be greater than about 1 MPa. The tension under which the pellicle P is held in the pellicle frame F may, for example, be less than about 15 MPa. The thickness d of the pellicle P may, for example, be greater than about 100 nm. The thickness d of the pellicle P may, for example, be less than about 1000 nm. The resonant frequency of the pellicle P when the pellicle P is held by the pellicle frame F may, for example, be greater than about 5 Hz. The resonant frequency of the pellicle P when the pellicle P is held by the pellicle frame F may, for example, be less than about 50 Hz.

Second parameters regarding the expected movement of the pellicle P may include, for example, a time at which a rate of change of an acceleration of the pellicle is non-zero, a rate of change of an acceleration, i.e., jerk, of the pellicle P, an acceleration of the pellicle P, a velocity of the pellicle P, a position of the pellicle P, etc. Second parameters regarding the expected movement of the pellicle P may be measured and/or modelled. The jerk of the pellicle P may, for example, be greater than about 10000 $ms^{-3}$. The jerk of the pellicle P may, for example, be less than about 20000 $ms^{-3}$. The acceleration of the pellicle P may, for example, be greater than about 50 $ms^{-2}$. The acceleration of the pellicle P may, for example, be less than about 200 $ms^{-2}$. The velocity of the pellicle P may, for example, be greater than about 0.5 $ms^{-1}$. The velocity of the pellicle P may, for example, be less than about 10 $ms^{-1}$.

A second step S2 of the method includes applying the first and second parameters to a model which predicts deflection of the pellicle P as a function of the first and second parameters. The model comprises a plurality of sub-models which relate to different components of deflection of the pellicle P. In the example of FIG. 6, the model consists of three sub-models, with each sub-model being represented by a graph showing how the pellicle deflects as a result of the component of deflection of the pellicle P that is represented by the sub-model.

A first sub-model 51 models deflection of the pellicle P as a damped wave arising from a vibrational component of deflection of the pellicle P. The first sub-model 51 may be referred to as a vibrational sub-model. A period of motion of the pellicle P during which a rate of change of acceleration of the pellicle P is non-zero may excite a vibration of the pellicle at a resonant frequency of the pellicle P, i.e., an eigenfrequency or resonant frequency of the pellicle P with boundaries of the vibration being defined by contact areas with the pellicle frame F. For example, each of the first T2, second T4 and third T6 jerk periods discussed above in relation to the typical exposure scan cycle may induce vibrations of the pellicle P. The induced vibrations may not have subsided before the target portion C is exposed to radiation during the exposure period T10. Thus, the induced vibrations may contribute to the introduction of aberrations to the image projected onto the target portion C of the substrate W.

Different movements of the pellicle P may contribute to the vibrational component of deflection of the pellicle P that is modelled by the first sub-model 51. For example, a magnitude of the vibration of the pellicle P that is induced by a jerk period may at least partially depend on an acceleration of the pellicle P and/or the rate of change of acceleration of the pellicle P. Vibrations of the pellicle P induced at different times throughout movement of the pellicle P may interfere with each other and thereby affect the total deflection experienced by the pellicle P. For example, a phase of a given vibration may at least partially depend on the time at which a non-zero jerk induced the given vibration. The phase of the vibration may at least partially depend on a time at which a jerk period ends. For example, the exposure scan cycle of FIG. 5 includes four jerk periods. The first sub model 51 may at least partially act to add these four vibrations together and thereby determine a total excitation of vibration of the pellicle P. The relative phases of the four vibrations may at least partially depend upon the time at which each jerk period ended. A time period of each vibration may at least partially depend upon the resonant frequency of the pellicle P when the pellicle P is held by the pellicle frame F. A deflection of the pellicle P modelled by the first sub-model 51 may, for example, be determined at least in part by a combination, for example a convolution, of the total excitation of vibration of the pellicle P and a harmonic, for example the second harmonic, of the pellicle P in the pellicle-frame system F. Thus, the first sub-model 51 may receive at least one of the following set of parameters regarding expected movement of the pellicle P: a time at which a rate of change of an acceleration of the pellicle is non-zero, i.e., one or more time periods of non-zero jerk in the exposure scan, such as the first T2 and/or second T4 jerk periods discussed in relation to FIG. 5; a rate of change of an acceleration of the pellicle P; and an acceleration of the pellicle P. Each of these parameters may contribute to the induced vibration of the pellicle P and the associated deflection of the pellicle P.

After being induced during a jerk period, the vibration of the pellicle P is attenuated or damped over time due to losses such as, for example, resistance to pellicle movement caused by the gas that is in communication with the pellicle P. Parameters relevant to the deflection of the pellicle P that may be calibrated using the first sub-model 51 include a frequency of the induced vibration of the pellicle P, a strength of the damping acting on the induced vibration, an amplitude of the vibration at a known acceleration and/or a known rate of change of acceleration, etc. These parameters may be modelled using, for example, computational fluid dynamics before being utilized in the method of FIG. 6.

A second sub-model 52 models deflection of the pellicle P as an exponential decay component arising from an inertia of a gas that is in communication with the pellicle P, i.e., the gas that is in enclosed by the pellicle P, mask MA, and frame F as discussed in relation to FIG. 3. The second sub-model 52 may be referred to as an inertia sub-model. A pressure gradient along the pellicle P is induced at a start of a scanning motion of the pellicle P. The magnitude of the pressure gradient may at least partially depend upon an acceleration of the pellicle P and/or a rate of change of acceleration of the pellicle P. An interference between the deflection of the pellicle P caused by the pressure gradient and other deflections of the pellicle P may at least partially depend upon a time at which the pressure gradient is induced, for example a time at which the pellicle experiences a non-zero jerk. The second sub-model 52 at least partially acts to combine the exponential decay component with parameters associated with one or more acceleration profiles of the pellicle P, for example, the first and second acceleration profiles discussed in relation to FIG. 5. A deflection of the pellicle modelled by the second sub-model 52 may, for example, be determined at least in part by a combination, e.g., a convolution, of the exponential decay component with a harmonic, e.g., the second harmonic, of the pellicle P in the pellicle-frame system F. Thus, the second sub-model 51 may receive at least one of the following set of parameters regarding expected movement of the pellicle P: 1) a time at which a rate of change of an acceleration of the pellicle is non-zero, i.e., one or more time periods of non-zero jerk in the exposure scan, such as the first and/or second jerk periods discussed in relation to FIG. 5; 2) a rate of change of an acceleration of the pellicle P; and 3) an acceleration of the pellicle P.

The induced pressure gradient relaxes exponentially. A time constant of the exponential decay of the pressure gradient may, for example, be between about 5 ms and about 50 ms, e.g., about 20 ms. Parameters that may be calibrated using the second sub-model 52 include a rate of decay of the pressure gradient, an amplitude of an overlay error at a known acceleration and/or at a known change in acceleration resulting from the pressure gradient, etc. These parameters may be modelled using, for example, computational fluid dynamics before being utilized in the method of FIG. 6.

A third sub-model 53 models deflection of the pellicle P as a deformation component arising from pressure variations of a gas that is in communication with the pellicle P during movement of the pellicle P. The third sub-model 53 may be referred to as a pressure variation model. As discussed above in relation to FIG. 3, gas flows around the mask assembly MS and support structure MT causing a deflection of the pellicle P. In the example of FIG. 6, the pellicle deflection associated with the third sub-model 53, is modelled as a form of cubic function. The pellicle deflection associated with the third sub-model 53 may take other forms, for example a quadratic function. The magnitude of this component of deflection of the pellicle P increases with an increasing velocity of the pellicle P. The magnitude of the pellicle deflection may scale with the velocity of the pellicle P raised to the power of a value greater than or equal to about one and a half. The magnitude of the pellicle deflection may scale with the velocity of the pellicle P raised to the power of a value that is less than or equal to about two and a half. For example, the magnitude of the pellicle deflection may scale with the velocity of the pellicle P squared. The value that the velocity of the pellicle P is raised to may be adjusted in order to tune and improve and accuracy of the model. Thus, the third sub-model 53 may receive at least one of the following parameters regarding expected movement of the pellicle P: a velocity of the pellicle P; and, a position of the pellicle P. A parameter that may be calibrated using the third sub-model 53 is an overlay error induced by deflection of the pellicle P at a known speed, for example a maximum speed of the pellicle P during an exposure scan, due to pressure variations.

The third sub-model 53 may be further configured to model deflections of the pellicle P that are not accommodated by the first and second sub-models 51, 52. For example, the lithographic errors associated with pellicle deflections described by the first and second sub-models 51, 52 may be deducted from the total lithographic error associated with all pellicle deflections, e.g., the overlay errors shown in FIG. 4, and any remaining lithographic errors may be fitted to the third sub-model 53. As another example, a combined amplitude of the pellicle deflection predicted by the first sub-model 51 and the pellicle deflection predicted by the second sub-model 52 may be deducted from a total deflection of the pellicle P to model the remaining deflection of the pellicle.

First parameters regarding the properties of the pellicle P may also contribute to the pellicle deflections described by the three sub-models 51-53. For example, a tension at which the pellicle P is held in the pellicle frame F may at least partially determine a frequency of induced vibrations described by the first sub-model 51, a time constant of the exponential decay of the pressure gradient described by the second sub-model 52, and/or an extent of the deflection described by the third sub-model 53. Hence the model receives these parameters in order to accurately predict deflection of the pellicle P and the resulting lithographic errors.

In the example of FIG. 6, the method includes an optional third step S3 of combining the outputs from the sub-models 51 to 53. The outputs of the sub-models 51 to 53 may be combined under the assumption that the sub-models are independent of one another. That is, the contributions to pellicle deflection that are predicted by each sub-model 51-53 may be added together assuming that their contributions are sufficiently independent. The skilled person will appreciate that in reality the contributions to the deflection of the pellicle P from each of the sub-models are in fact interdependent. For example, a deflection of the pellicle P described by the second 52 and third 53 sub-models affects a tension experienced by the pellicle P, which in turn affects a vibration experienced by the pellicle P as described by the first sub-model 51. However, the inventors have realized that the pellicle deflections resulting from the interdependencies of the sub-models 51-53 are insignificant and may be disregarded without significantly adversely affecting an accuracy of the pellicle deflection model. This assumption advantageously assists in simplifying what would otherwise be a complex model of the pellicle deflection, as previously mentioned.

The method may be used to predict pellicle deflection during a scan-up movement and/or during a scan-down movement. That is, if, for example, second parameters regarding the expected movement of the pellicle P differed between a scan-up movement and a scan-down movement then the method may be used twice. The first use of the method may include using a first set of second parameters associated with the scan-up movement to predict deflection of the pellicle P during the scan-up movement. The second use of the method may include using a different set of second parameters associated with the scan-down movement to predict deflection of the pellicle P during the scan-down movement.

Figure 7:
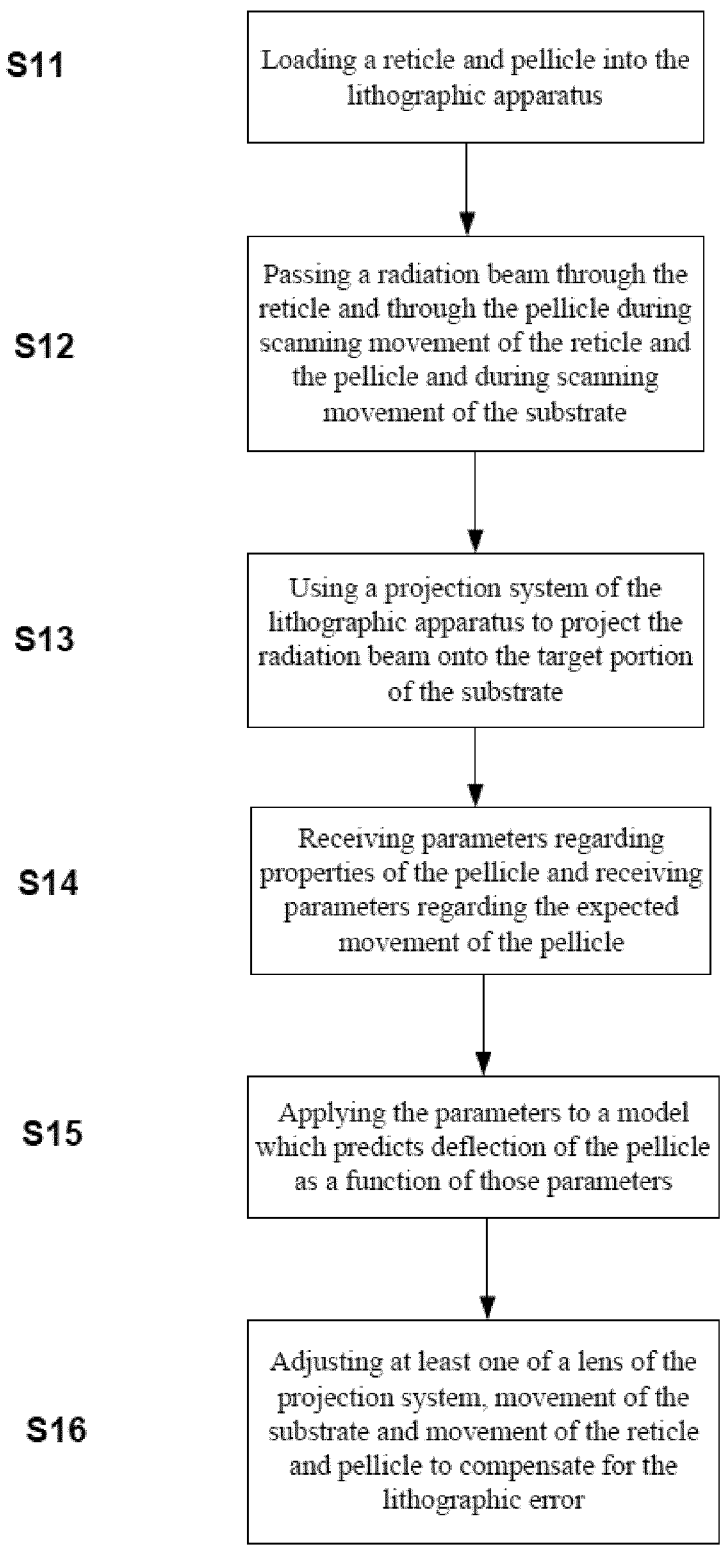
FIG. 7 shows a method of performing a scanning exposure of a target portion of a substrate using a lithographic apparatus according to an embodiment of the invention; and, FIG. 8 shows a method of generating a model for predicting deflection of a pellicle according to an embodiment of the invention.

FIG. 7 shows a method of performing a scanning exposure of a target portion C of a substrate W using a lithographic apparatus according to an embodiment of the invention. A first step S11 of the method includes loading a reticle MA and the pellicle P into the lithographic apparatus. A second step S12 of the method includes passing a radiation beam PB through the reticle MA and through the pellicle P during scanning movement of the reticle MA and the pellicle P and during scanning movement of the substrate W. As previously discussed, movement of the pellicle P will induce deflection of the pellicle P. A third step S13 of the method includes using a projection system PS of the lithographic apparatus to project the radiation beam PB onto the target portion C of the substrate W. As previously discussed, the deflection of the pellicle P will introduce aberrations to the image carried by the projected radiation beam PB. A fourth step S14 of the method includes receiving first parameters regarding properties of the pellicle P and receiving second parameters regarding the expected movement of the pellicle P. As previously discussed, different first and second parameters may be received for scan-up movements and scan-down movements. A fifth step S15 of the method includes applying the first and second parameters to a model which predicts deflection of the pellicle P as a function of the first and second parameters. As previously discussed, second parameters associated with the scan-up movement may be applied to predict pellicle deflection during the scan-up movement and second parameters associated with the scan-down movement may be applied to predict pellicle deflection during the scan-down movement. The fourth and fifth steps S14, S15 of the method of FIG. 7 correspond with the first and second steps S1, S2 of the method of FIG. 6. The predicted pellicle deflections may be converted into a lithographic error using physics, for example via an optical aberration model. Parameters that may be used when converting the pellicle deflections into a lithographic error may, for example, include a distance between the pellicle P and the reticle MA, a refractive index of the pellicle P, etc. The distance between the pellicle P and the reticle MA may, for example, be greater than about 1 mm. The distance between the pellicle P and the reticle MA may, for example, be less than about 20 mm. The refractive index of the pellicle P may, for example, be greater than about 0.5. The refractive index of the pellicle P may, for example, be less than about 2.

A sixth step S16 of the method includes adjusting at least one of a lens of the projection system PS, movement of the substrate W and movement of the reticle MA and the pellicle P to compensate for the lithographic error. The type of adjustment and/or the extent of the adjustment may vary during the scan. For example, a position of a lens in the projection system PS may be adjusted with respect to the reticle MA, pressure may be applied to one or more lenses of the projection system PS, one or more lenses of the projection system PS may be heated or cooled, etc.

Some lithographic processes involve performing a first set of exposures of a substrate W using a lithographic apparatus that comprises a pellicle P, e.g., a DUV lithographic apparatus, and performing another set of exposures of the substrate W using a lithographic apparatus that does not comprise a pellicle P. The effect of the pellicle deflection is present for one set of exposures but is not present for the other set of exposures. This difference may lead to what may be referred to as matching error. The matching error may result in significant lithographic errors, for example overlay errors, particularly between patterns exposed with the pellicle P and patterns exposed without the pellicle P on a single substrate W. By predicting the pellicle deflection and compensating for the associated lithographic errors using the method of FIG. 7 during the exposure in which the pellicle P is present, matching errors may be significantly reduced.

Figure 8:
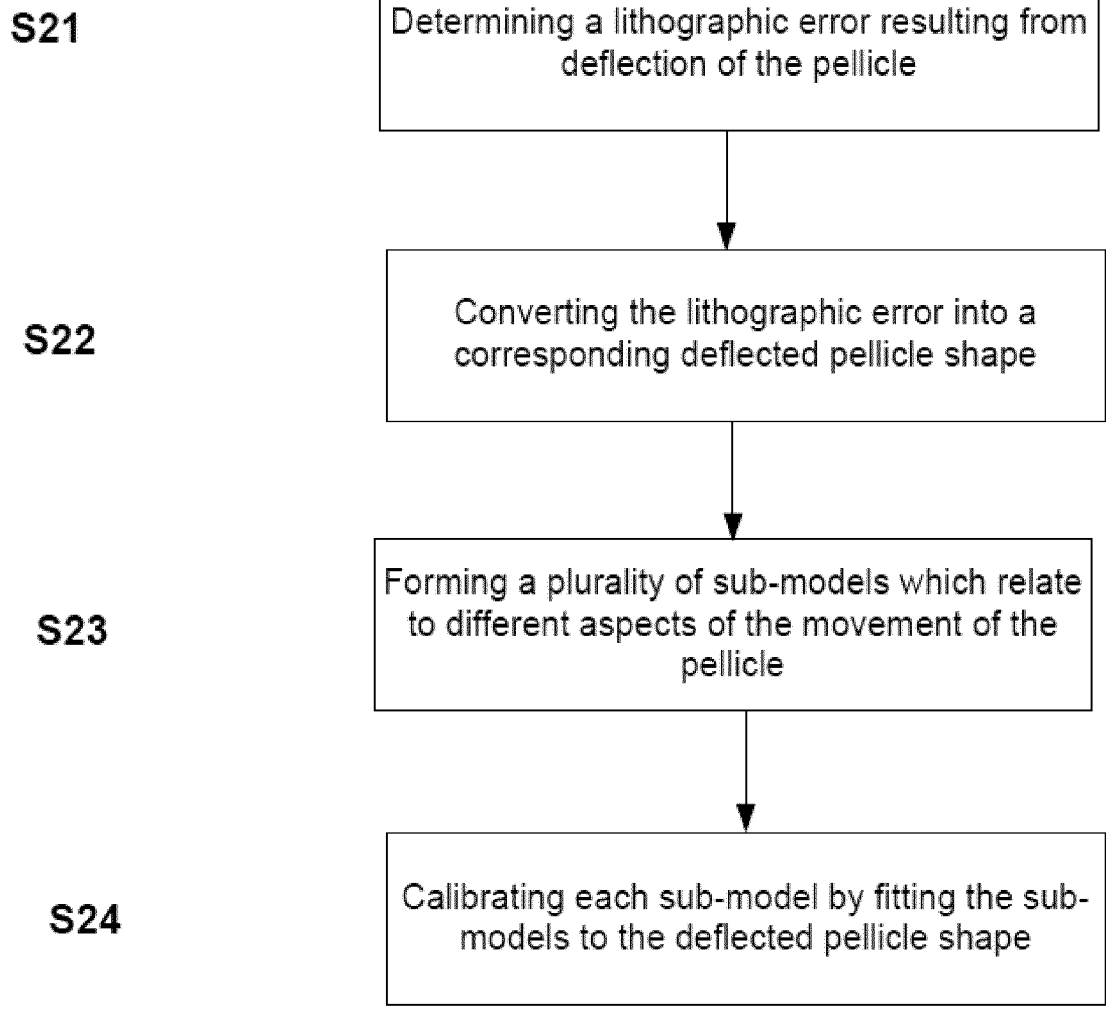

FIG. 8 shows a method of generating a model for predicting deflection of a pellicle P according to an embodiment of the invention. A first step S21 of the method includes determining a lithographic error resulting from deflection of the pellicle P. The first step S21 may include moving the pellicle P in a scanning direction to induce deflection of the pellicle P whilst projecting an image through the pellicle P and measuring the projected image to determine a lithographic error resulting from the deflection of the pellicle P. The lithographic error may be measured by means of a sensor, for example by using an interferometer, which receives the projected image after it has passed through the pellicle P and/or by exposing a resist with the projected image and comparing the image formed on the resist with an intended image. When determining the resulting lithographic error a de-magnification and/or image reversal characteristics of the projection system PS of the lithographic apparatus may be accounted for. A plurality of lithographic errors may be determined. For example, different overlay errors associated with different acceleration profiles may be determined. Motion of the pellicle P may be varied in order to vary both the deflection of the pellicle P and the resulting lithographic error. For example, movement of the pellicle P may be varied such that the pellicle P experiences different rates of change of acceleration, different accelerations and different velocities at different times and/or positions throughout the exposure scan. In general, increasing the amount by which movement of the pellicle P is varied and determining the resulting lithographic errors improves an accuracy of the model because the model will have a greater amount of relevant information to make predictions with.

A second step S22 of the method includes converting the lithographic error into a corresponding deflected pellicle shape. The second step S22 may involve using physics equations to convert the determined lithographic error into the corresponding deflected shape of the pellicle, e.g., using Snell's law as discussed in relation to FIG. 2. For example, a variation of a z-position of the pellicle P (or "height" of the pellicle) along the scanning direction of the reticle stage MT may be determined. Additionally or alternatively, a variation of an angle between the surface normal of the pellicle P and an optical axis of the lithographic apparatus, i.e., the z-axis, along the scanning axis of the reticle stage MT may be determined. The relevant physical parameters that affect deflection of the pellicle P may be determined using stand-alone devices and/or lithographic apparatus.

A third step S23 of the method includes forming a plurality of sub-models which relate to different aspects of the movement of the pellicle P. The plurality of sub-models may, for example, correspond with the three sub-models discussed in relation to FIG. 6, for example a vibrational sub-model 51, an inertia sub-model 52, and a pressure variation model 53.

A fourth step S24 of the method includes calibrating each sub-model by fitting the sub-models to the deflected pellicle shape. The fourth step S24 may, for example, comprise performing non-linear chi-square fitting to reduce (or minimise) the a difference between the deflection of the pellicle P predicted by the sub-models and the deflection of the pellicle P determined using the lithographic errors discussed in the first step S21. The result of the fit may provide an accurate model for predicting pellicle deflection, for example, as a function of the scanning direction of the pellicle P and the reticle stage MT.

Once the fourth step S24 is complete, the generated model may then be used to predict a deflection of the pellicle P by receiving any given combination of parameters regarding properties of the pellicle P and parameters regarding expected movement of the pellicle P as a model input, i.e., the first step S1 of the method shown in FIG. 6. The method of FIG. 8 may be performed multiple times to generate different models. For example, the method of FIG. 8 may be performed using parameters associated with the scan-up movement in order to generate a model for predicting deflection of the pellicle P during the scan-up movement. As another example, the method of FIG. 8 may be performed using parameters associated with the scan-down movement in order to generate a model for predicting deflection of the pellicle P during the scan-down movement. The model generated by the method of FIG. 8 may then be used to predict pellicle deflections for a variety of scanning movements and the results of the model may be used to at least partially predict lithographic errors associated with those different scanning movements. The predicted lithographic errors may then be at least partially accounted for, for example by adjusting at least one of a lens of the projection system PS, the movement of the substrate W, and the movement of the reticle MA and the pellicle P. Hereby, the actual lithographic error may be reduced.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine, e.g., a computing device. For example, a machine-readable medium may include read only memory (ROM); random access memory (RAM); magnetic storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

Embodiments are provided according to the following clauses:

1. A method of predicting a deflection of a pellicle resulting from a movement of the pellicle in a lithographic apparatus, the method comprising:
   receiving first parameters comprising properties of the pellicle;
   receiving second parameters comprising properties of the expected movement of the pellicle; and
   applying the first and second parameters to a model arranged to predict the deflection of the pellicle as a function of the first and second parameters,
   wherein the model comprises a plurality of sub-models, each sub-model relates to a different component of the deflection of the pellicle, and each sub-model providing an output.

2. The method of clause 1, wherein the model is arranged to combine the outputs of the plurality of sub-models, and wherein the model includes an assumption that the plurality of sub-models are independent of one another.

3. The method of clause 2, wherein at least one of the plurality of sub-models relates to a component of the deflection of the pellicle in dependence of at least one of the following first set of aspects of the movement of the pellicle:
   a time at which a rate of change of an acceleration of the pellicle is non-zero;
   a rate of change of an acceleration of the pellicle; and,
   an acceleration of the pellicle.

4. The method of clause 3, wherein a first sub-model is arranged to use at least one of the first set of aspects to model the deflection of the pellicle as a damped wave in dependence of a vibration of the pellicle.

5. The method of clause 3 or clause 4, wherein a second sub-model is arranged to use at least one of the first set of aspects to model the deflection of the pellicle as an exponential decay in dependence of an inertia of a gas that is in communication with the pellicle.

6. The method of any of clauses 2 to 5, wherein at least one of the plurality of sub-models relates to a component of the deflection of the pellicle in dependence of at least one of the following second set of aspects of the movement of the pellicle:
   a velocity of the pellicle; and,
   a position of the pellicle.

7. The method of clause 6, wherein a third sub-model is arranged to use at least one of the second set of aspects to model the deflection of the pellicle as a deformation in dependence of pressure variations of a gas that is in communication with the pellicle during movement of the pellicle.

8. The method of clause 4, wherein a second sub-model is arranged to use at least one of the first set of aspects to model the deflection of the pellicle as an exponential decay in dependence of an inertia of a gas that is in communication with the pellicle, and wherein at least one of the plurality of sub-models relates to a component of the deflection of the pellicle in dependence of at least one of the following second set of aspects of the movement of the pellicle:

a velocity of the pellicle; and, a position of the pellicle, wherein a third sub-model uses at least one of the second set of aspects to model the deflection of the pellicle as a deformation in dependence of pressure variations of a gas that is in communication with the pellicle during movement of the pellicle, wherein the third sub-model further models the deflection of the pellicle which is not accommodated by the first and second sub-models.

9. A method of performing a scanning exposure of a target portion of a substrate within a lithographic apparatus, the method comprising:

loading a reticle and a pellicle into the lithographic apparatus;

passing a radiation beam through the reticle and through the pellicle during scanning movement of the reticle and the pellicle and during scanning movement of the substrate;

using a projection system of the lithographic apparatus to project the radiation beam onto the target portion of the substrate; and adjusting at least one of a lens of the projection system, the scanning movement of the substrate and a scanning movement of the reticle and the pellicle during the scanning exposure to compensate for a lithographic error due to the deflection of the pellicle, wherein the deflection of the pellicle is predicted by the method according to any of clauses 1 to 8.

10. A computer program comprising computer readable instructions configured to control a computer to carry out the method according to any of clauses 1 to 9.

11. A computer readable medium carrying the computer program according to clause 10.

12. A computer apparatus for predicting deflection of the pellicle resulting from the movement of the pellicle in a lithographic apparatus comprising a memory storing processor readable instructions, and a processor arranged to read and execute instructions stored in said memory, wherein said processor readable instructions comprise instructions arranged to control the computer to carry out the method according to any of clauses 1 to 9.

13. A lithographic apparatus arranged to project a pattern from a patterning device onto a substrate, the lithographic apparatus comprising the computer apparatus according to clause 12.

14. A metrology device comprising the computer apparatus according to clause 12.

15. A method of generating a model for predicting a deflection of a pellicle resulting from the movement of the pellicle in a lithographic apparatus, the method comprising:

determining a lithographic error resulting from the deflection of the pellicle;

converting the determined lithographic error into a corresponding deflected pellicle shape;

forming a plurality of sub-models that relate to different components of the deflection of the pellicle; and, calibrating each sub-model by fitting the plurality of sub-models to the deflected pellicle shape.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method comprising:

receiving first parameters comprising properties of a pellicle;

receiving second parameters comprising properties of an expected movement of the pellicle in a lithographic apparatus; and applying, by a hardware computer system, the first and second parameters to a model arranged to predict a deflection of the pellicle as a function of the first and second parameters, wherein the model comprises a plurality of sub-models, each sub-model relating to a different component of the deflection of the pellicle, and each sub-model providing an output, and wherein a sub-model of the plurality of sub-models is arranged to model the deflection of the pellicle as a damped wave in dependence of a vibration of the pellicle and/or model the deflection of the pellicle as an exponential decay in dependence of an inertia of a gas that is in communication with the pellicle.

2. The method of claim 1, wherein the model is arranged to combine the outputs of the plurality of sub-models, and wherein the model includes an assumption that the plurality of sub-models are independent of one another.

3. The method of claim 2, wherein at least one of the plurality of sub-models relates to a component of the deflection of the pellicle in dependence of at least one selected from:

a time at which a rate of change of an acceleration of the pellicle is non-zero;

a rate of change of an acceleration of the pellicle; and/or an acceleration of the pellicle.

4. The method of claim 2, wherein a sub-model of the plurality of sub-models is arranged to model the deflection of the pellicle as a damped wave in dependence of a vibration of the pellicle.

5. The method of claim 4, wherein the sub-model of the plurality of sub-models arranged to model the deflection of the pellicle as a damped wave in dependence of a vibration of the pellicle is a first sub-model, wherein a second sub-model of the plurality of sub-models is arranged to model the deflection of the pellicle as an exponential decay in dependence of an inertia of a gas that is in communication with the pellicle, wherein at least one of the plurality of sub-models relates to a component of the deflection of the pellicle in dependence of at least one selected from:

a velocity of the pellicle; and/or a position of the pellicle, and wherein a third sub-model is arranged to model the deflection of the pellicle as a deformation in dependence of pressure variations of a gas that is in communication with the pellicle during movement of the pellicle, wherein the third sub-model further models the deflection of the pellicle which is not accommodated by the first and second sub-models.

6. The method of claim 2, wherein a sub-model of the plurality of sub-models is arranged to model the deflection of the pellicle as an exponential decay in dependence of an inertia of a gas that is in communication with the pellicle.

7. The method of claim 2, wherein at least one of the plurality of sub-models relates to a component of the deflection of the pellicle in dependence of at least one selected from:
 a velocity of the pellicle; and/or
 a position of the pellicle.

8. The method of claim 7, wherein a sub-model of the plurality of sub-models is arranged to model the deflection of the pellicle as a deformation in dependence of pressure variations of a gas that is in communication with the pellicle during movement of the pellicle.

9. A method of performing a scanning exposure of a target portion of a substrate within a lithographic apparatus, the method comprising:
 loading a reticle and a pellicle into the lithographic apparatus;
 passing a radiation beam through the reticle and through the pellicle during scanning movement of the reticle and the pellicle and during scanning movement of the substrate;
 using a projection system of the lithographic apparatus to project the radiation beam onto the target portion of the substrate; and
 adjusting one or more selected from: an optical element of the projection system, the scanning movement of the substrate, and/or a scanning movement of the reticle and the pellicle for the scanning exposure, to compensate for a lithographic error due to the deflection of the pellicle, wherein the deflection of the pellicle is predicted by the method of claim 1.

10. A computer apparatus for predicting deflection of the pellicle resulting from the movement of the pellicle in a lithographic apparatus comprising:
 a memory storing processor readable instructions, and
 a processor arranged to read and execute instructions stored in the memory, wherein the processor readable instructions comprise instructions arranged to control the computer apparatus to carry out the method of claim 1.

11. A lithographic apparatus arranged to project a pattern from a patterning device onto a substrate, the lithographic apparatus comprising the computer apparatus according to claim 10.

12. A metrology device comprising the computer apparatus according to claim 10.

13. A non-transitory computer readable medium having computer-readable instructions therein, the instructions, when executed by a computer system, configured to cause the computer system to at least:
 receive first parameters comprising properties of a pellicle;
 receive second parameters comprising properties of an expected movement of the pellicle in a lithographic apparatus; and
 apply the first and second parameters to a model arranged to predict a deflection of the pellicle as a function of the first and second parameters,
 wherein the model comprises a plurality of sub-models, each sub-model relating to a different component of the deflection of the pellicle, and each sub-model providing an output, and
 wherein a sub-model of the plurality of sub-models is arranged to model the deflection of the pellicle as a damped wave in dependence of a vibration of the pellicle and/or model the deflection of the pellicle as an exponential decay in dependence of an inertia of a gas that is in communication with the pellicle.

14. The computer readable medium of claim 13, wherein the model is arranged to combine the outputs of the plurality of sub-models, and wherein the model includes an assumption that the plurality of sub-models are independent of one another.

15. The computer readable medium of claim 13, wherein at least one of the plurality of sub-models relates to a component of the deflection of the pellicle in dependence of at least one selected from:
 a time at which a rate of change of an acceleration of the pellicle is non-zero;
 a rate of change of an acceleration of the pellicle; and/or
 an acceleration of the pellicle.

16. The computer readable medium of claim 13, wherein a sub-model of the plurality of sub-models is arranged to model the deflection of the pellicle as a damped wave in dependence of a vibration of the pellicle.

17. The computer readable medium of claim 13, wherein a sub-model of the plurality of sub-models is arranged to model the deflection of the pellicle as an exponential decay in dependence of an inertia of a gas that is in communication with the pellicle.

18. The computer readable medium of claim 13, wherein at least one of the plurality of sub-models relates to a component of the deflection of the pellicle in dependence of at least one selected from:
 a velocity of the pellicle; and/or
 a position of the pellicle.

19. The computer readable medium of claim 18, wherein a sub-model of the plurality of sub-models is arranged to model the deflection of the pellicle as a deformation in dependence of pressure variations of a gas that is in communication with the pellicle during movement of the pellicle.

20. A method comprising:
 determining a lithographic error resulting from deflection of a pellicle resulting from the movement of the pellicle in a lithographic apparatus;
 converting the determined lithographic error into a corresponding deflected pellicle shape;
 forming a plurality of sub-models that relate to different components of the deflection of the pellicle, each sub-model configured to provide an output; and
 calibrating, by a hardware computer system, each sub-model by fitting the plurality of sub-models to the deflected pellicle shape.

* * * * *